United States Patent
Shimizu et al.

(10) Patent No.: US 11,606,022 B2
(45) Date of Patent: Mar. 14, 2023

(54) INSULATION DETERIORATION MONITORING APPARATUS AND INSULATION DETERIORATION MONITORING METHOD

(71) Applicant: Toshiba Mitsubishi-Electric Industrial Systems Corporation, Tokyo (JP)

(72) Inventors: Ryo Shimizu, Tokyo (JP); Naotake Miyasaka, Tokyo (JP); Takato Sonoda, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 232 days.

(21) Appl. No.: 16/772,176

(22) PCT Filed: Jan. 29, 2018

(86) PCT No.: PCT/JP2018/002764
§ 371 (c)(1),
(2) Date: Jun. 12, 2020

(87) PCT Pub. No.: WO2019/146114
PCT Pub. Date: Aug. 1, 2019

(65) Prior Publication Data
US 2021/0072317 A1    Mar. 11, 2021

(51) Int. Cl.
*G01R 31/14* (2006.01)
*H02M 1/32* (2007.01)
(Continued)

(52) U.S. Cl.
CPC .............. *H02M 1/32* (2013.01); *G01R 31/14* (2013.01); *G01R 31/34* (2013.01); *H02P 27/06* (2013.01)

(58) Field of Classification Search
CPC ........ G01R 31/34; G01R 31/14; G01R 31/50; G01R 31/52; G01R 31/58; G01R 31/1272; G01R 31/12; H02P 27/06–14
See application file for complete search history.

(56) References Cited

U.S. PATENT DOCUMENTS

| | | | |
|---|---|---|---|
| 2005/0151658 A1* | 7/2005 | Kono | B60L 3/0023 324/541 |
| 2008/0007277 A1* | 1/2008 | Backhaus | G01R 31/52 324/713 |

(Continued)

FOREIGN PATENT DOCUMENTS

| | | | |
|---|---|---|---|
| CN | 102169155 A | * 8/2011 | ............ B60L 15/007 |
| CN | 106104955 A | * 11/2016 | ................ H02J 3/36 |

(Continued)

OTHER PUBLICATIONS

Extended European Search Report dated Aug. 5, 2021 in European Application No. 18902638.8.
(Continued)

*Primary Examiner* — Patrick Assouad
*Assistant Examiner* — Demetrius R Pretlow
(74) *Attorney, Agent, or Firm* — Xsensus LLP

(57) ABSTRACT

The insulation deterioration monitoring apparatus comprises a computer on which software is installed. The software causes the computer to execute at least first to fourth processes. In the first process, during stopping of at least one inverter unit, the computer selects one inverter unit out of the stopped inverter units and causes the inverter corresponding to the selected inverter unit to generate a direct current voltage. In the second process, the computer measures the current value of the ground current while the corresponding motor driving inverter generates the direct current voltage. In the third process, the computer records the measured current value of the ground current for each (Continued)

inverter unit in association with the selected inverter unit. Then, in the fourth process, based on the measured current value of the ground current recorded for each inverter unit, the computer analyzes the tendency of insulation deterioration of each inverter unit.

11 Claims, 3 Drawing Sheets

(51) Int. Cl.
  *G01R 31/34* (2020.01)
  *H02P 27/06* (2006.01)

(56) References Cited

U.S. PATENT DOCUMENTS

| | | | | |
|---|---|---|---|---|
| 2008/0084215 | A1* | 4/2008 | Itten | H02H 7/1227 |
| | | | | 324/510 |
| 2010/0171511 | A1* | 7/2010 | Horikoshi | G01R 31/1263 |
| | | | | 324/551 |
| 2012/0217922 | A1* | 8/2012 | Sato | G01R 31/346 |
| | | | | 318/490 |
| 2013/0002262 | A1* | 1/2013 | Tago | B60L 3/0069 |
| | | | | 324/503 |
| 2015/0256116 | A1* | 9/2015 | Tateda | H02M 5/458 |
| | | | | 318/504 |
| 2018/0091083 | A1* | 3/2018 | Satou | G01R 31/343 |
| 2020/0200832 | A1* | 6/2020 | Takeuchi | G01R 19/16528 |

FOREIGN PATENT DOCUMENTS

| | | | | |
|---|---|---|---|---|
| CN | 206908529 U | * | 1/2018 | |
| DE | 102010030129 A1 | * | 12/2011 | G01R 27/18 |
| DE | 102012101735 A1 | * | 9/2013 | H02J 3/383 |
| DE | 102015008831 A1 | * | 1/2017 | |
| JP | H1114688 A | * | 1/1997 | |
| JP | 2004-257955 A | | 9/2004 | |
| JP | 4098069 B2 | * | 6/2008 | |
| JP | 2009-204600 A | | 9/2009 | |
| JP | 2010197093 A | * | 9/2010 | |
| JP | 2012177695 A | * | 9/2012 | G01R 31/346 |
| JP | 2012233826 A5 | * | 5/2013 | |
| JP | 5622670 B2 | * | 11/2014 | |
| JP | 2015-169479 A | | 9/2015 | |
| JP | 2017-175795 A | | 9/2017 | |
| KR | 20090084687 A | * | 8/2009 | |

OTHER PUBLICATIONS

International Search Report and Written Opinion dated Apr. 10, 2018 for PCT/JP2018/002764 filed on Jan. 29, 2018, 8 pages including English Translation of the International Search Report.

* cited by examiner

INSULATION DETERIORATION MONITORING APPARATUS AND INSULATION DETERIORATION MONITORING METHOD

CROSS-REFERENCE TO RELATED APPLICATION

The present application is based on PCT filing PCT/JP2018/002764, filed Jan. 29, 2018, the entire contents of which are incorporated herein by reference.

TECHNICAL FIELD

The present invention relates to an insulation deterioration monitoring apparatus and an insulation deterioration monitoring method for monitoring the insulation deterioration of one or more motors, and in particular, to an insulation deterioration monitoring apparatus and an insulation deterioration monitoring method suitable for use in a motor driving system in which a plurality of inverters for driving the one or more motors receive power from a common converter.

BACKGROUND

A large number of motors are used in a large-scale plant such as a rolling plant. These motors are insulated from the ground. However, a motor may deteriorate in insulation and cause a ground fault. The ground fault hinders stable operation of the plant. For this reason, when the plant is shut down for periodic maintenance, the insulation deterioration states of motors are inspected.

In order to inspect the insulation deterioration state of a motor, it is necessary to measure the insulation resistance of the motor by using an insulation resistance meter between the motor terminal and the ground after disconnecting the connection between the inverter and the motor by a breaker. However, this method requires disconnecting the connection between the inverter and the motor for each motor. Further, this method requires measuring the insulation resistance for each motor. For this reason, a great deal of time and labor is required for inspection especially in a large-scale plant having several hundred motors.

Therefore, a large-scale plant having a large number of motors needs an art that can efficiently monitor the insulation deterioration states of the motors.

The insulation deterioration state of a motor can be determined from the magnitude of the ground current caused by the decrease of the insulation resistance between the motor and the ground. For example, according to a prior art disclosed in Patent Document 1, the ground current flowing through a resistance that grounds the output terminal of a converter to the ground is detected, and, when the magnitude of the ground current exceeds a predetermined threshold value, a protection operation such as stopping of a device and an alarm operation such as transmitting of an alarm are performed.

However, the prior art disclosed in Patent Document 1 is an art for detecting a ground fault that has occurred, and is not an art related to preventive maintenance for preventing the abnormality occurrence due to the insulation deterioration. The prior art disclosed in Patent Document 1 is based on a system in which a converter and an inverter are provided in a one-to-one relationship. Patent Document 1 does not disclose an art that can be applied to a system such as a large-scale plant in which power is supplied to a plurality of inverters from a common converter.

PRIOR ART LITERATURE

[Patent Document]
[Patent Document 1] JP-A-2017-175795

SUMMARY

Technical Problem

The present invention has been made in view of the above described problems in the motor driving system in which a plurality of inverters for driving one or more motors receive power from a common converter. An object of the present invention is to provide an apparatus and a method capable of efficiently monitoring the insulation deterioration of the one or more motors driven by each inverter.

[Solution to Problem]

An insulation deterioration monitoring apparatus according to the present invention is an apparatus applied to a motor driving system comprising: a plurality of inverter units including a motor driving inverter and one or more motors; a converter for supplying power to each of the plurality of inverter units; and a ground current measuring instrument for measuring ground current flowing between an output terminal of the converter and the ground.

The insulation deterioration monitoring apparatus according to the present invention comprises a computer on which software is installed. The software causes the computer to execute at least a first process, a second process, a third process, and a fourth process. In the first process, during stopping of at least one of the plurality of inverter units, the computer selects one inverter unit out of stopped inverter units and causes a corresponding motor driving inverter corresponding to the selected inverter unit to generate a direct current voltage. In the second process, the computer measures the current value of the ground current by the ground current measuring instrument while the corresponding motor driving inverter generates the direct current voltage. In the third process, the computer records the current value of the ground current measured by the second process, for each inverter unit in association with the selected inverter unit. Then, in the fourth process, based on the measured data of the current value of the ground current recorded for each inverter unit, the computer analyzes the tendency of insulation deterioration of each of the plurality of inverter units.

According to the insulation deterioration monitoring apparatus according to the present invention, generation of the direct current voltage by the inverter is performed only in one stopped inverter unit out of the plurality of inverter units. This process reveals which inverter unit has the insulation deterioration that generates the ground current measured by the ground current measuring instrument. Then, the measured data of the current value of the ground current is recorded for each inverter unit, and the tendency of the insulation deterioration of each of the plurality of inverter units is analyzed based on the measured data for each inverter unit. These processes contribute to efficient monitoring of the insulation deterioration of the one or more motors for each inverter unit.

The software may cause the computer to execute a fifth process. In the fifth process, when abnormality occurrence is detected in any one of the plurality of inverter units from the analysis result obtained in the fourth process, the computer notifies a user of the abnormality occurrence. The notified user can cope with a ground fault beforehand, which is one of the causes hindering the stable operation of the plant.

The computer may include a first computer and a second computer connected each other through a network. In this case, the software may include first software for causing the first computer to execute at least the first process, the second process, and the third process, and second software for causing the second computer to execute at least the fourth process. According to this configuration, the fourth process of analyzing the measurement data can be executed in a place, a region, or a country different from the location where the other processes are executed.

In the second process, the computer may start measuring the current value of the ground current after a predetermined time has elapsed after the direct current voltage is generated by the corresponding inverter. By setting a time difference between the generation of the direct current voltage and the measurement of the current value of the ground current, it is possible to avoid the influence of the transitional phenomenon caused by the generation of the direct current voltage.

In the second process, the computer may measure the current value of the ground current multiple times while the direct current voltage is generated by the corresponding motor driving inverter. Multiple measurements increase the measurement accuracy of the current value of the ground current.

In the first process, the computer may select one inverter unit during stopping of all the inverter units and generate the direct current voltage by the inverter corresponding to the selected inverter unit. No ground current flows when all the inverter units are stopped. By generating the direct current voltage by the inverter only in one inverter unit in this state, the ground current generated in the inverter unit is measured accurately.

In the third process, the computer may record the current value of the ground current measured when at least one of the plurality of inverter units is in operation as a reference value. When at least one of the inverter units is in operation, ground current may be generated in the inverter unit in operation. Therefore, by treating the current value measured in such a state as the reference value, the reliability of the measurement data is prevented from deteriorating.

An insulation deterioration monitoring method according to the present invention is a method of monitoring motor insulation deterioration for each inverter unit, in a motor driving system comprising: a plurality of inverter units including a motor driving inverter and one or more motors; a converter for supplying power to each of the plurality of inverter units; and a ground current measuring instrument for measuring ground current flowing between an output terminal of the converter and the ground.

The insulation deterioration monitoring method according to the present invention includes at least a first step, a second step, a third step, and a fourth step. The first step is a step of selecting one inverter unit out of stopped inverter units during stopping of at least one of the plurality of inverter units, and causing a corresponding motor driving inverter corresponding to the selected inverter unit to generate a direct current voltage. The second step is a step of measuring the current value of the ground current by the ground current measuring instrument while the corresponding motor driving inverter generates the direct current voltage. The third step is a step of recording the current value of the ground current measured in the second step, for each inverter unit in association with the selected inverter unit. Then, the fourth step is a step of analyzing the tendency of insulation deterioration of each of the plurality of inverter units based on the measured data of the current value of the ground current recorded for each inverter unit.

According to the insulation deterioration monitoring method according to the present invention, generation of the direct current voltage by the inverter is performed only in one stopped inverter unit out of the plurality of inverter units. This process reveals which inverter unit has the insulation deterioration that generates the ground current measured by the ground current measuring instrument. Then, the measured data of the current value of the ground current is recorded for each inverter unit, and the tendency of the insulation deterioration of each of the plurality of inverter units is analyzed based on the measured data for each inverter unit. These processes contribute to efficient monitoring of the insulation deterioration of the one or more motors for each inverter unit.

The insulation deterioration monitoring method according to the present invention may further include a fifth step of notifying a user of abnormality occurrence when the abnormality occurrence is detected in any one of the plurality of inverter units from the analysis result obtained in the fourth step. The notified user can cope with a ground fault beforehand, which is one of the causes hindering the stable operation of the plant.

In the insulation deterioration monitoring method according to the present invention, at least the first process, the second process, and the third process may be executed by a first computer, and at least the fourth process may be executed by a second computer connected to the first computer through a network. According to this configuration, the fourth step of analyzing the measurement data can be executed in a place, a region, or a country different from the location where the other steps are executed.

[Advantageous Effects]

According to the insulation deterioration monitoring apparatus and the insulation deterioration monitoring method according to the present invention, in a motor driving system provided in a large-scale plant in which a plurality of inverters for driving one or more motors receive power from a common converter, the motor insulation deterioration can be efficiently monitored for each inverter unit.

DESCRIPTION OF EMBODIMENTS

Figure 1:
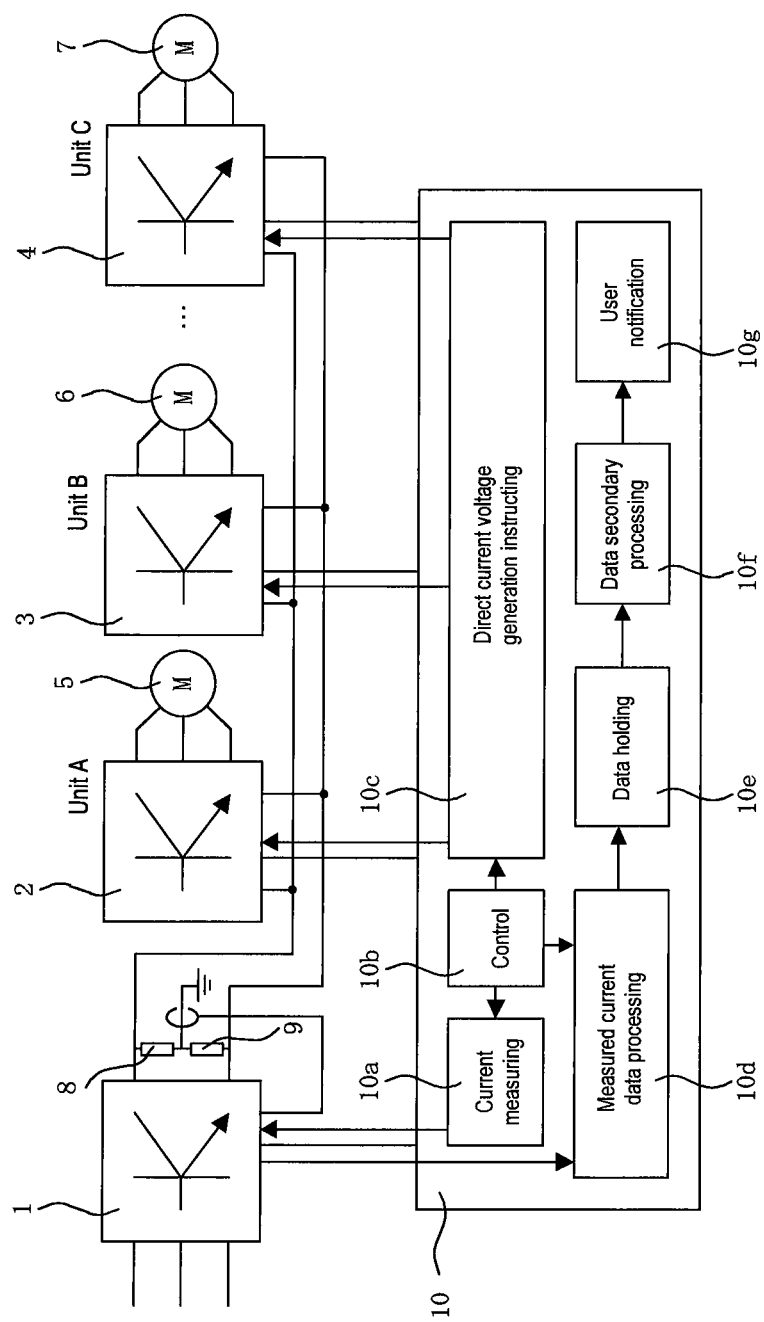
FIG. 1 is a block diagram showing a configuration and a data flow of a motor driving system to which an insulation deterioration monitoring apparatus according to a first embodiment of the present invention is applied.

The following is a description of embodiments of the present invention with reference to the accompanying drawings. In the drawings, the same or corresponding parts are denoted by the same reference numerals, and overlapping descriptions are appropriately simplified or omitted. The present invention is not limited to the following embodiments, and various modifications can be made without departing from the spirit of the present invention.

First Embodiment

FIG. 1 is a block diagram showing a configuration and a data flow of a motor driving system to which an insulation deterioration monitoring apparatus according to the first embodiment of the present invention is applied. The motor driving system of the first embodiment is configured, for example, as a motor driving system of a rolling mill in a rolling plant. The motor driving system of the first embodiment includes a plurality of motors 5, 6, 7 provided in each rolling stand constituting the rolling mill, a plurality of motor driving inverters 2, 3, 4 in pairs with the plurality of motors 5, 6, 7, and a common converter 1 for supplying power to each of the plurality of inverters 2, 3, 4.

The inverters 2, 3, 4 have a function to apply a direct current voltage to the motors 5, 6, 7 according to a direct current voltage generation instruction through a communication from a computer 10 to be described later. However, the direct current voltage in this specification may be a voltage of which the positive/negative sign does not change depending on the time, and is not limited to a perfect direct current voltage. The direct current voltage in this specification also includes a voltage such that a ripple component is superimposed on a direct current voltage component. For example, adding a direct current bias greater than the maximum amplitude of an alternating current voltage to the alternating current voltage generates a voltage of which the positive/negative sign does not change depending on the time (i.e., the direct current voltage described herein).

A pair of the inverters 2,3,4 and the motors 5,6,7 constitute one unit. However, the number of motors per unit is not limited to one. One unit can also be configured with one inverter and a plurality of motors connected thereto. The unit composed of one inverter and one or a plurality of motors is referred to as an inverter unit in this specification. Here, three inverter units of A, B, and C are provided. However, this is an example, the power supply from the common converter 1 may be performed to two inverter units, or may be performed to more inverter units. In the following, the inverter unit is simply referred to as a unit.

The positive output terminal and the negative output terminal of the common converter 1 are connected by an upper voltage dividing resistance 8 and a lower voltage dividing resistance 9. The middle point between the upper voltage dividing resistance 8 and the lower voltage dividing resistance 9 is grounded to the ground. The common converter 1 measures the ground current flowing through the upper voltage dividing resistance 8 and the lower voltage dividing resistance 9 based on a ground current measurement instruction via communication from a computer 10, which is discussed below. The common converter 1 outputs the measured value to the computer 10 via communication with the computer 10. That is, the common converter 1 functions as a ground current measuring instrument.

The computer 10 is connected to the common converter 1 and the inverters 2, 3, 4 in a mutual communicable manner through a LAN, for example. The computer 10 is installed with control software. When the control software stored in a memory is executed by a processor, the computer 10 functions as the ground current measuring section 10*a*, the timing control section 10*b*, the direct current voltage generation instructing section 10*c*, the measured current data processing section 10*d*, the data holding section 10*e*, the data secondary processing section 10*f*, and the user notification section 10*g*. The following describes each function.

First, when the motor 5 of the unit A is stopped, the direct current voltage generation instructing section 10*c* sends a direct current voltage generation instruction to the inverter (corresponding inverter) 2 of the unit A corresponding to the motor 5 based on an instruction requesting direct current voltage generation input from the timing control section 10*b*. Based on the direct current voltage generation instruction, the inverter 2 applies a direct current voltage to the motor 5.

When a voltage application time set by the control software has passed after sending a signal to generate the direct current voltage to the direct current voltage generation instructing section 10*c*, the timing control section 10*b* sends a signal to stop the direct current voltage generation instruction to the direct current voltage generation instructing section 10*c*.

The direct current voltage generation instructing section 10*c* stops the direct current voltage generation instruction sent to the inverter 2, based on the signal requesting to stop the direct current voltage input from the timing control section 10*b*. The inverter 2 stops generating the direct current voltage that has been applied to the motor 5 according to the stopped direct current voltage generation instruction.

When a standby time set by the control software has passed after the direct current voltage was applied to the motor 5 by the inverter 2, the timing control section 10*b* sends a signal to measure the ground current to the ground current measuring section 10*a*. The standby time is set to avoid the influence by transitional phenomena caused by the generation of the direct current voltage.

The ground current measuring section 10*a* sends a ground current measurement instruction to the common converter 1 multiple times based on a signal requesting to measure the ground current input from the timing control section 10*b*. Based on the instruction, the common converter 1 outputs the current value of the measured ground current multiple times to the measured current data processing section 10*d*.

The measured current data processing section 10*d* processes the current values of the ground currents received multiple times from the common converter 1. Here, for example, the average value of the current values measured multiple times is calculated. The measured current data processing section 10*d* outputs the current value of the ground current after processing to the data holding section 10*e*.

The data holding section 10*e* receives information about the measurement target unit together with the current value of the ground current from the measured current data processing section 10*d*. Since the unit A is the measurement target here, the data holding section 10*e* records the current value of the ground current in association with the unit A.

Next, the control software executes the same processes as the above processes performed for the inverter 2 of the unit A and the common converter 1, for the inverter 3 of the unit B and the common converter 1. Then, the control software records the current value of the ground current measured in the processes to the data holding section 10*e* in association with the unit B.

Furthermore, the control software executes the same processes as the above processes performed for the inverter 2 of the unit A and the common converter 1, for the inverter 4 of the unit C and the common converter 1. Then, the control software records the current value of the ground current measured in the processes to the data holding section 10e in association with the unit C.

The control software executes the above-described processes within downtime during which the production line is temporarily stopped, such as during roll replacement of the rolling stand. According to the conventional method of measuring the insulation resistance of the motor by removing the connection between the inverter and the motor using a breaker, etc., the plant had to be stopped for several hours to several tens of hours. However, the insulation deterioration monitoring apparatus according to the first embodiment can complete the necessary processes within a few minutes of downtime.

The control software repeatedly executes the above described series of processes in accordance with the set measurement schedule. Thus, the current value of the ground current is recorded time sequentially in the data holding section 10e for each unit A, B, C. The measurement data recorded in the data holding section 10e are used for preventive maintenance related to a motor ground fault.

Incidentally, the process times for each inverter and the process order between the inverters is not limited in the above processes. The number of converters and inverters connected to the control software is not limited. Though the details will be described later, these settings can be changed by changing the processes in the timing control section 10b.

The data secondary processing section 10f processes the measured data of the current value of the ground current recorded for each motor in the data holding section 10e, for example, using a method such as machine learning, and analyzes the tendency of the insulation deterioration for each unit from the measured data. As a specific example, the data secondary processing section 10f calculates the pattern of time variation of the current value of the ground current for each motor, and determines for each unit whether the current value of the ground current exceeds an abnormal determination value within a set period. The data secondary processing section 10f outputs a signal to the user notification section 10g when determining that any one of the units has an abnormality as a result of monitoring the tendency.

When receiving the signal from the data secondary processing section 10f, the user notification section 10g notifies the user that an abnormality has occurred. As a method of the notification, for example, a method of giving a notification by pop-up on the screen of plant monitoring software, a method of sending a mail to a person in charge of maintenance of the electric equipment of the plant, or the like may be used. The notified user can cope with the motor ground fault beforehand, which is one of the causes hindering the stable operation of the plant.

Figure 2:
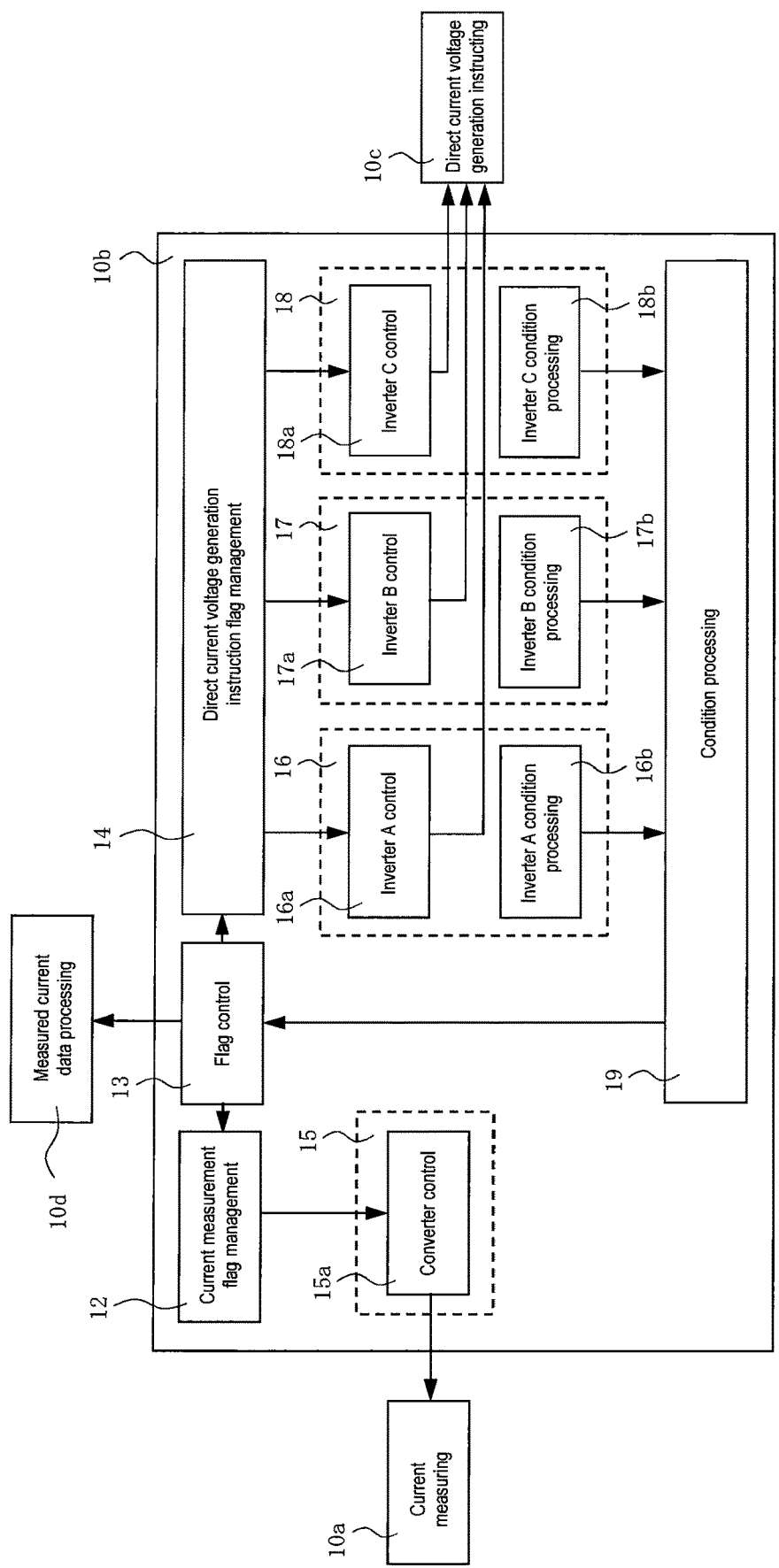
FIG. 2 is a block diagram showing a configuration and a data flow of a timing control section of the insulation deterioration monitoring apparatus.

Next, the following describes the processes in the timing control section 10b with reference to FIG. 2. In the timing control section 10b, common converter software 15, inverter A software 16, inverter B software 17, and inverter C software 18 operate independently of each other. The inverter A software 16 is software corresponding to the inverter 2 of the unit A shown in FIG. 1, the inverter B software 17 is software corresponding to the inverter 3 of the unit B shown in FIG. 1, the inverter C software 18 is software corresponding to the inverter 4 of the unit C shown in FIG. 1.

The common converter software 15 causes the computer 10 (refer to FIG. 1) to function as the common converter control section 15a. The inverter A software 16 causes the computer 10 to function as the inverter A control section 16a and also as the inverter A condition processing section 16b. The inverter B software 17 causes the computer 10 to function as the inverter B control section 17a and also as the inverter B condition processing section 17b. The inverter C software 18 causes the computer 10 to function as the inverter C control section 18a and also as the inverter C condition processing section 18b.

To apply a direct current voltage from an inverter to a motor, it is necessary to clear interlock conditions for ensuring the safety of people and the machine, such as that the motor is stopped and that no excitation current is not outputted from the inverter to the motor. Each of the inverters 2, 3, 4 has a control parameter corresponding to the interlock condition, and can output a value thereof to the computer 10 through communication.

The inverter A condition processing section 16b, the inverter B condition processing section 17b, and the inverter C condition processing section 18b read the values of the control parameters which are interlock conditions from the corresponding inverters 2, 3, 4, respectively. The sections 16b and 17b output the read values to the condition processing section 19. The condition processing section 19 is shared among the inverter A software 16, the inverter B software 17, and the inverter C software 18.

The condition processing section 19 determines whether or not to execute the measurement processes and the priority order between the measurement processes from the values of the control parameters serving as the interlock conditions received from the inverter A software 16, the inverter B software 17, and the inverter C software 18, and outputs the determined results to the flag control section 13. The measurement process is a process of measuring the current value of the ground current and holding the measurement result in the data holding section 10e (refer to FIG. 1). The priority order means the execution order of the measurement process between the units A, B, and C.

The flag control section 13 outputs flag signals to flag tables held by the ground current measurement flag managing section 12 and the direct current voltage generation instruction flag managing section 14 by a signal received from the condition processing section 19. For example, if the interlock conditions are satisfied in the order of the unit A, the unit B, the unit C, the flag control section 13 outputs a flag signal to the flag table held by the direct current voltage generation instruction flag managing section 14 to generate a direct voltage in the order of the unit A, the unit B, and the unit C. Further, as to measure the current value of the ground current in accordance with the timing of generating the direct current voltage, the flag control section 13 outputs the flag signal to the flag table held by the ground current measurement flag managing section 12.

The flag control section 13 also outputs a flag signal to the measured current data processing section 10d. This flag is prepared to identify whether the measurement data is obtained when all the units are stopped, or whether the measurement data is obtained when at least one unit is in operation.

When all units are stopped, no ground current due to the insulation deterioration flows from any unit. However, when at least one unit is in operation, ground current may occur even in the unit in operation. Thus, when the flag signal indicating that at least one unit is in operation, the measured current data processing section 10d records, as a reference value, the current value measured at the time to the data holding section 10e. Deterioration in reliability of the measured data can be prevented by changing the handling method of the current value of the ground current between when all units are stopped and when at least one unit is in operation.

The common converter software 15 monitors the flag table held by the ground current measurement flag managing section 12 using the common converter control section 15*a*. When the flag is erected in the ground current measurement flag managing section 12, a signal requesting to measure the ground current is output from the common converter control section 15*a* to the ground current measuring section 10*a* so as to send a ground current measurement instruction to the common converter 1.

The inverter A software 16, the inverter B software 17, and the inverter C software 18 monitor the flag table held by the direct current voltage generation instruction flag managing section 14 using the inverter A control section 16*a*, the inverter B control section 17*a*, and the inverter C control section 18*a*, respectively. Then, when the flag of the unit A is erected in the direct current voltage generation instruction flag managing section 14, the inverter A control section 16*a* outputs a signal requesting to generate a direct current voltage to the direct current voltage generation instructing section 10*c* so that a direct current voltage generation instruction will be sent to the inverter 2 of the unit A. The same processes are executed when the flag of the unit B is erected in the direct current voltage generation instruction flag managing section 14 or when the flag of the unit C is erected in the direct current voltage generation instruction flag managing section 14.

The number of software operating inside the timing control section 10*b*, such as the common converter software 15, the inverter A software 16, the inverter B software 17, and the inverter C software 18, is not limited. It can be changed according to the number of converters and inverters connected to the control software.

The insulation deterioration monitoring apparatus according to the first embodiment has been described above. According to the insulation deterioration monitoring apparatus according to the first embodiment, in a system such as a large-scale plant in which many motors are connected to a inverter, the motor insulation deterioration can be efficiently monitored for each inverter unit, and also, the motor ground fault which is one of the causes hindering the stable operation of the plant can be notified in advance.

In the first embodiment, the process executed by the timing control section 10*b* and the direct current voltage generation instructing section 10*c* corresponds to the first process defined in claim 1 and also corresponds to the first step defined in claim 8. The process executed by the timing control section 10*b* and the ground current measuring section 10*a* corresponds to the second process defined in claim 1 and also corresponds to the second step defined in claim 8. The process executed by the measured current data processing section 10*d* and the data holding section 10*e* corresponds to the third process defined in claim 1 and also corresponds to the third step defined in claim 8. The process executed by the data secondary processing section 10*f* corresponds to the fourth process defined in claim 1 and also corresponds to the fourth step defined in claim 8. The process executed by the user notification section 10*g* corresponds to the fifth process defined in claim 2 and also corresponds to the fifth step defined in claim 9.

Second Embodiment

In the first embodiment described above, the real-time process until the current value of the ground current is held in the data holding section 10*e* and the secondary process to the data held in the data holding section 10*e* by the data secondary processing section 10*f* are executed by the same software. However, executing the real-time process and the secondary process by the same software is not necessarily appropriate under various circumstances.

Figure 3:
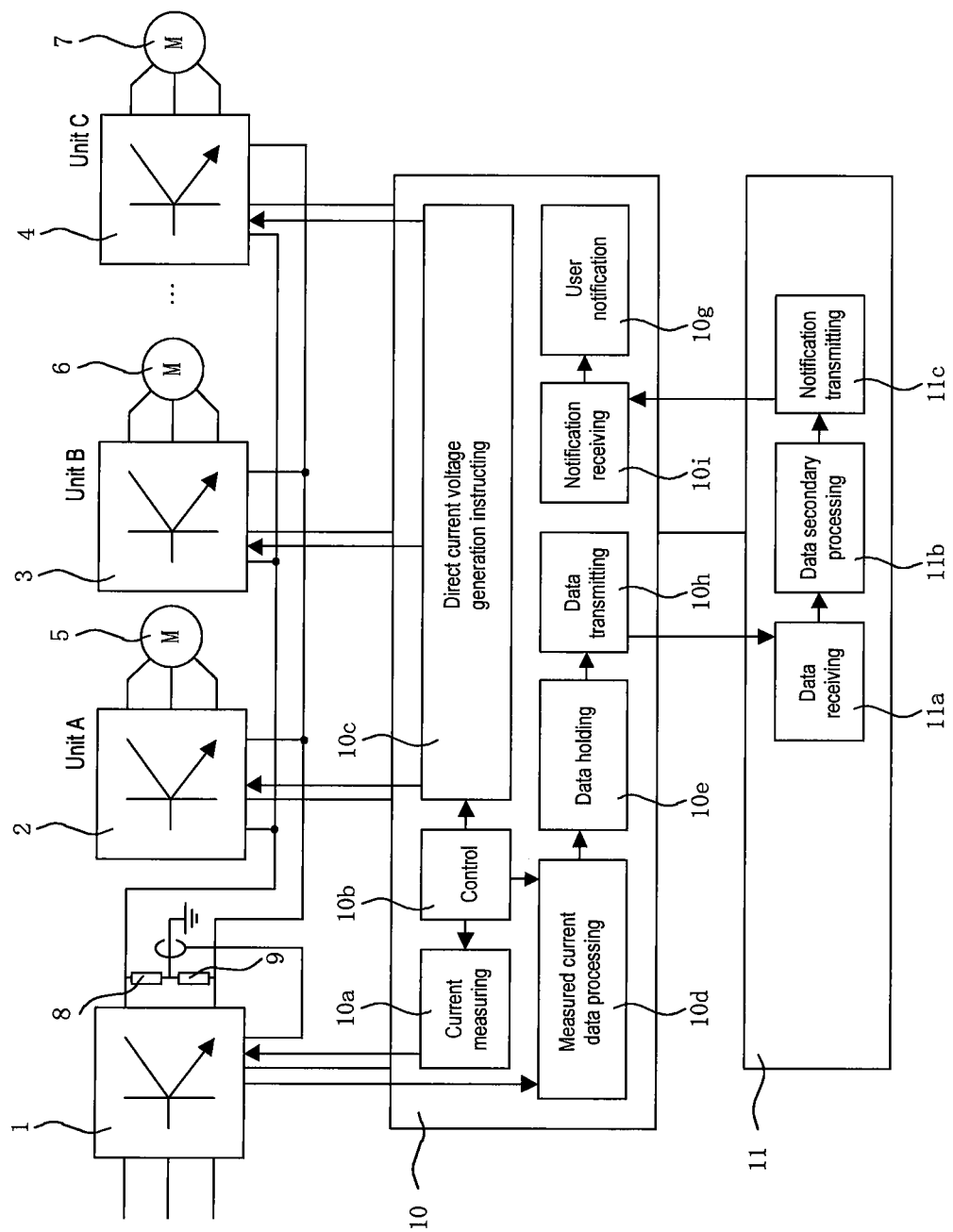
FIG. 3 is a block diagram showing a configuration and a data flow of a motor driving system to which an insulation deterioration monitoring apparatus according to a second embodiment of the present invention is applied.

Therefore, in the second embodiment of the present invention, the real-time process and the secondary process are executed by separate software. FIG. 3 is a block diagram showing a configuration and a data flow of a motor driving system to which an insulation deterioration monitoring apparatus according to the second embodiment of the present invention is applied. Incidentally, the motor driving system of the second embodiment, similarly to the first embodiment, is configured as a motor driving system of the rolling mill in the rolling plant, for example.

The insulation deterioration monitoring apparatus according to the second embodiment includes a first computer 10 in which control software (first software) for real-time process is installed, and a second computer 11 in which control software (second software) for secondary process to data is installed. The first computer 10 and the second computer 11 are connected to each other in a network such as a LAN, an intranet, or the internet. The second computer 11 may be located in a different location, region, or country from the first computer 10.

By executing the control software for real-time process on a processor, the first computer 10 functions as the ground current measuring section 10*a*, the timing control section 10*b*, the direct current voltage generation instructing section 10*c*, the measured current data processing section 10*d*, the data holding section 10*e*, the data transmitting section 10*h*, the notification receiving section 10*i*, and the user notification section 10*g*. Further, by executing the control software for secondary process to data on the processor, the second computer 11 functions as the data receiving section 11*a*, the data secondary processing section 11*b*, and notification transmitting section 11*c*. Incidentally, the configuration and the data flow shown in FIG. 2 is also applicable to the timing control section 10*b* of the insulation deterioration monitoring apparatus according to the second embodiment.

The data transmitting section 10*h* transmits the data held in the data holding section 10*e* from the first computer 10 to the second computer 11 at a fixed period, for example. The data receiving section 11*a* of the second computer 11 receives the data transmitted from the data transmitting section 10*h* and sends it to the data secondary processing section 11*b*.

The function of the data secondary processing section 11*b* is equivalent to the function of the data secondary processing section 10*f* of the first embodiment. The data secondary processing section 11*b* processes the data received from the data receiving section 11*a* using, for example, a technique such as machine learning, and outputs a signal to the notification transmitting section 11*c* when abnormality occurrence is confirmed from a result of monitoring the tendency of the processed data.

The notification transmitting section 11*c* transmits a signal from the second computer 11 to the first computer 10 based on the signal received from the data secondary processing section 11*b*. The notification receiving section 10*i* of the first computer 10 receives the data transmitted from the notification transmitting section 11*c* and sends it to the user notification section 10*g*.

The insulation deterioration monitoring apparatus according to the second embodiment has been described above. According to the insulation deterioration monitoring apparatus according to the second embodiment, in a system such as a large-scale plant in which many inverters are connected to a common converter, the motor insulation deterioration can be efficiently monitored for each inverter unit, and also, the motor ground fault which is one of the causes hindering the stable operation of the plant can be notified in advance. Further, according to the insulation deterioration monitoring apparatus according to the second embodiment, the secondary process to data can be executed in a place, region, or country different from the location of the motor driving system on which the real-time process is executed.

The relationship between the insulation deterioration monitoring apparatus according to the second embodiment and the elements defined in the claims corresponds to the relationship between the insulation deterioration monitoring apparatus according to the first embodiment and the elements defined in the claims. However, in the second embodiment, the processing by the data secondary processing section 11b of the second computer 11 corresponds to the fourth processing defined in claim 1 and corresponds to the fourth step defined in claim 8.

REFERENCE SIGNS LIST

1 Common converter
2 Inverter of unit A
3 Inverter of unit B
4 Inverter of unit C
5 Motor of unit A
6 Motor of unit B
7 Motor of unit C
8 Upper voltage dividing resistance
9 Lower voltage dividing resistance
10 Computer (first computer)
10a Ground current measuring section
10b Timing control section
10c Direct current voltage generation instructing section
10d Measured current data processing section
10e Data holding section
10f Data secondary processing section
10g User notification section
10h Data transmitting section
10i Notification receiving section
11 Second computer
11a Data receiving section
11b Data secondary processing section
11c Notification transmitting section
12 Ground current measurement flag managing section
13 Flag control section
14 Direct current voltage generation instruction flag managing section
15 Common converter software
15a Common converter control section
16 Inverter A software
16a Inverter A control section
16b Inverter A condition processing section
17 Inverter B Software
17a inverter B control section
17b inverter B condition processing section
18 Inverter C Software
18a Inverter C control section
18b Inverter C condition processing section
19 Condition processing section

The invention claimed is:

1. An insulation deterioration monitoring apparatus applied to a motor driving system comprising a plurality of inverter units including a motor driving inverter and one or more motors, and a converter for supplying power to each of the plurality of inverter units, the insulation deterioration monitoring apparatus monitoring insulation deterioration in each of the plurality of inverter units, the insulation deterioration monitoring apparatus comprising a computer on which software is installed, the software being configured to cause the computer to execute:

a first process of selecting one inverter unit out of stopped inverter units during stopping of at least one of the plurality of inverter units and causing a corresponding motor driving inverter corresponding to a selected inverter unit to generate a direct current voltage;

a second process of measuring a current value of ground current flowing between an output terminal of the converter and ground performed by the converter based on an instruction from the computer while the corresponding motor driving inverter generates the direct current voltage;

a third process of recording the current value of the ground current measured by the second process, for each inverter unit in association with the selected inverter unit; and a fourth process of analyzing a tendency of insulation deterioration of each of the plurality of inverter units based on measured data of the current value of the ground current recorded for each inverter unit.

2. The insulation deterioration monitoring apparatus according to claim 1, wherein the software causes the computer to execute a fifth process of notifying a user of abnormality occurrence when the abnormality occurrence is detected in any one of the plurality of inverter units from an analysis result obtained in the fourth process.

3. The insulation deterioration monitoring apparatus according to claim 1, wherein the computer includes a first computer and a second computer connected each other through a network, and wherein the software includes first software for causing the first computer to execute at least the first process, the second process, and the third process, and second software for causing the second computer to execute at least the fourth process.

4. The insulation deterioration monitoring apparatus according to claim 1, wherein, in the second process, the computer starts measuring the current value of the ground current after a predetermined time has passed after the direct current voltage is generated by the corresponding motor driving inverter.

5. The insulation deterioration monitoring apparatus according to claim 1, wherein, in the second process, the computer measures the current value of the ground current multiple times while the direct current voltage is generated by the corresponding motor driving inverter.

6. The insulation deterioration monitoring apparatus according to claim 1, wherein, in the first process, the computer selects one inverter unit during stopping of all the inverter units and generates the direct current voltage by the corresponding motor driving inverter corresponding to the selected inverter unit.

7. The insulation deterioration monitoring apparatus according to claim 1, wherein, in the third process, the computer records the current value of the ground current measured when at least one of the plurality of inverter units is in operation as a reference value.

8. An insulation deterioration monitoring method of monitoring motor insulation deterioration for each inverter unit, in a motor driving system comprising a plurality of inverter units including a motor driving inverter and one or more motors, and a converter for supplying power to each of the plurality of inverter units, and a ground current measuring instrument for measuring ground current flowing between an output terminal of the converter and ground, the insulation deterioration monitoring method comprising:
a first step of selecting one inverter unit out of stopped inverter units during stopping of at least one of the plurality of inverter units, and causing a corresponding motor driving inverter corresponding to selected inverter unit to generate a direct current voltage;
a second step of measuring the current value of the ground current by the ground current measuring instrument while the corresponding motor driving inverter generates the direct current voltage;
a third step of recording the current value of the ground current measured in the second step, for each inverter unit in association with the selected inverter unit, and
a fourth step of analyzing a tendency of insulation deterioration of each of the plurality of inverter units based on measured data of the current value of the ground current recorded for each inverter unit.

9. The insulation deterioration monitoring method according to claim 8, further comprising a fifth step of notifying a user of abnormality occurrence when the abnormality occurrence is detected in any one of the plurality of inverter units from an analysis result obtained in the fourth step.

10. The insulation deterioration monitoring method according to claim 8,
wherein at least the first step, the second step, and the third step are executed by a first computer, and at least the fourth step is executed by a second computer connected to the first computer through a network.

11. An insulation deterioration monitoring apparatus applied to a motor driving system, comprising:
a plurality of inverters each including a motor driving inverter and one or more motors;
a converter to supply power to each of the plurality of inverters; and
circuitry configured to
during at least one of the plurality of inverters stops, select one inverter from the at least one of stopping inverters,
cause a corresponding motor driving inverter corresponding to the selected inverter to generate a direct current voltage,
measure a current value of ground current flowing between an output terminal of the converter and ground while the corresponding motor driving inverter generates the direct current voltage,
record the measured current value of the ground current in association with the selected inverter, on a basis of inverter, and
analyze a tendency of insulation deterioration of each of the plurality of inverters based on measured data of the current value of the ground current recorded for each inverter.

* * * * *